(12) United States Patent
Iinaga

(10) Patent No.: US 6,492,007 B1
(45) Date of Patent: Dec. 10, 2002

(54) MULTI-LAYER PRINTED CIRCUIT BARE BOARD ENABLING HIGHER DENSITY WIRING AND A METHOD OF MANUFACTURING THE SAME

(75) Inventor: Hiroshi Iinaga, Joetsu (JP)

(73) Assignee: Oki Printed Circuits Co., Ltd., Niigata (JP)

( * ) Notice: Subject to any disclaimer, the term of this patent is extended or adjusted under 35 U.S.C. 154(b) by 0 days.

(21) Appl. No.: 09/666,408

(22) Filed: Sep. 20, 2000

(30) Foreign Application Priority Data

Mar. 14, 2002 (JP) .................................. 2000-069637

(51) Int. Cl.⁷ .............................................. B32B 3/00
(52) U.S. Cl. ....................... 428/209; 174/250; 174/261; 174/262; 428/901
(58) Field of Search ............................ 428/209, 901; 174/250, 254, 261, 262

(56) References Cited

U.S. PATENT DOCUMENTS

| | | | | |
|---|---|---|---|---|
| 5,198,295 A | * | 3/1993 | Arthur et al. | 428/901 |
| 5,218,761 A | * | 6/1993 | Moniwa et al. | 428/901 |
| 5,263,243 A | * | 11/1993 | Taneda et al. | 428/901 |
| 5,495,665 A | * | 3/1996 | Carpenter et al. | 427/96 |
| 5,758,413 A | | 6/1998 | Chong et al. | |
| 6,013,588 A | * | 1/2000 | Ozaki | 428/209 |
| 6,037,547 A | | 3/2000 | Blish, II | |
| 6,085,415 A | * | 7/2000 | Gandhi et al. | 29/852 |
| 6,197,425 B1 | * | 3/2001 | Sekimoto et al. | 428/209 |

FOREIGN PATENT DOCUMENTS

| | | |
|---|---|---|
| DE | 36 05 474 A1 | 8/1987 |
| JP | 01 084786 | 3/1989 |
| JP | 05 114788 | 5/1993 |
| JP | 06 077662 | 3/1994 |
| JP | 06 310867 | 11/1994 |
| JP | 08 107280 | 4/1996 |
| JP | 09 246724 | 9/1997 |
| JP | 10 335828 | 12/1998 |
| JP | 2000 151111 | 5/2000 |

OTHER PUBLICATIONS

"Laser Drilled Microvias Present and Future", Sri Venkat, Oct. 2000; pp. 10–17.

* cited by examiner

*Primary Examiner*—Cathy Lam
(74) *Attorney, Agent, or Firm*—Birch, Stewart, Kolasch & Birch, LLP

(57) ABSTRACT

With a multi-layer printed circuit bare board has 2n circuit layers, where n is a natural number exceeding a unity, electrical connections are established between the (2i−1)-th layer and the 2i-th layer, where i=1, 2 . . . , n, by holes which are created through insulation material layers in between and filled with copper plating. Electrical connections are also accomplished between the 4i-th layer and the (4i−3)-th layer by holes created through insulation material layers in between and filled with copper plating. Higher dimensional accuracy and fewer process steps are achieved.

19 Claims, 2 Drawing Sheets

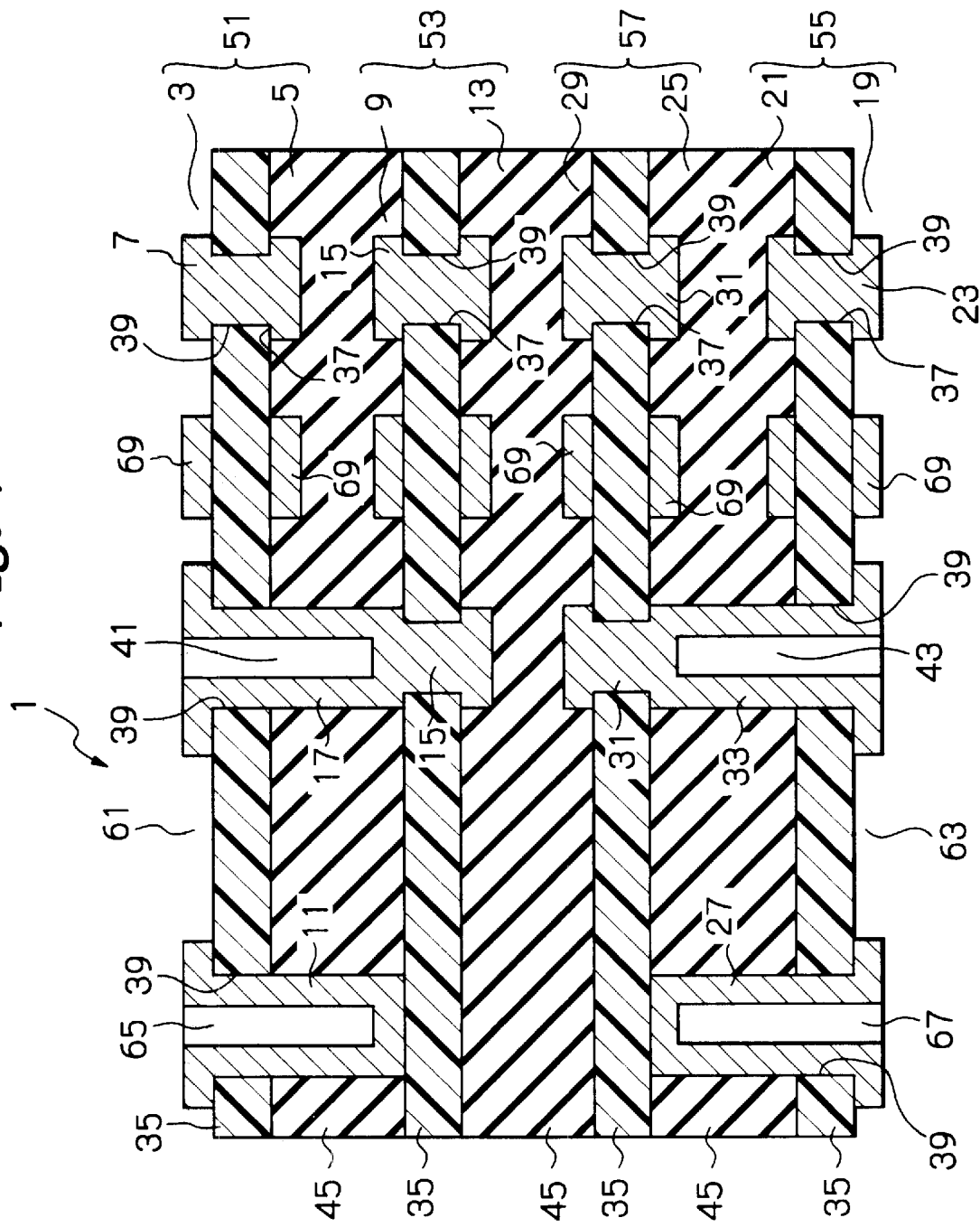

MULTI-LAYER PRINTED CIRCUIT BARE BOARD ENABLING HIGHER DENSITY WIRING AND A METHOD OF MANUFACTURING THE SAME

BACKGROUND OF THE INVENTION

1. Field of the Invention

The present invention relates to a multi-layer printed circuit bare board, and more particularly to such a board which enables higher density wiring, and also a method of manufacturing the same.

2. Description of the Background Art

A further quest for higher wiring density is requested in printed circuit bare boards along with the trend of higher function and higher density interconnection of electronic equipment. Multi-layer printed circuit bare boards have been put to use in order to meet the request. Multi-layer printed circuit bare boards consist of insulating layers and conductive layers accumulated with one on the other with the terminals of electronic parts mounted on the surface of the substrate, such as the solder bumps of BGAs (ball grid arrays), connected to an intended layer through the conductive holes, or via holes, which penetrate between the layers. In order to make the wiring density higher with the multi-layer printed circuit bare boards, reducing the width of conductive wiring patterns, reducing the spacing between conductive wiring patterns, reducing the diameters of lands and via holes, and eliminating via holes, for example, would be effective.

However, with conventional multi-layer printed circuit bare boards, it is getting difficult to draw out signal lines from BGA terminals using via holes, because via holes leave less space for wiring. In order to overcome the problem, a built-up structure of multi-layer printed boards may be used which can have smaller via holes and fewer through holes than conventional multi-layer boards. Built-up multi-layer printed circuit bare boards are manufactured in a "build-up" method, with which a conductive layer is formed over another conductive layer subsequently, so that the more layers require the more process steps. For example, at least the following process steps would be needed to make built-up boards; 1) a surface treatment process to increase adhesion between resin and conductive material, 2) applying insulation material (resin) over a conductive layer, 3) cure of the resin, 4) lasering (hole-making), 5) removing resin smear, 6) electroless copper deposition, 7) electrical copper plating, 8) photo-imaging and copper-etching, and 9) cure of the resin.

Built-up multi-layer printed circuit bare boards confronted some difficulty with BGA packaging when a via hole is wanted under a solder bump foot since the via hole is not filled sufficiently so that some amount of solder is taken in the via hole leaving insufficient amount of solder for joint. This problem forced putting connection lands between the solder bump lands, which placed a limitation to higher wiring density of the printed bare boards.

Moreover, with the conventional multi-layer built-up printed circuit boards, when the surface, or first, layer is required to be connected to the fourth layer from the surface, the process includes 27 process steps, which are three times as many as the above-mentioned process steps 1)–9), which has increased the manufacturing cost of built-up multi-layer boards.

In addition, with the manufacturing process of a conventional built-up structure of multi-layer printed circuit bare boards as described above, The interconnection between the first and fourth layers requires the boards to be subject to a resin cure process up-to three times, which may generate excessive heat to cause warp in the resin, resulting in a dimensional inaccuracy.

SUMMARY OF THE INVENTION

It is an object of the present invention to give a solution to these problems, more specifically to provide a multi-layer printed circuit bare board, and a method of manufacturing the same, in which a connection is established between conductive layers with another conductive layer intervening in between with better dimensional accuracy and fewer process steps than those of conventional built-up multi-layer printed circuit bare boards.

In accordance with the present invention, a multi-layer printed circuit bare board, which has 2n circuit layers, where n is a natural number exceeding a unity, includes electrical connections established between the $(2i-1)$-th layer and the $2i$-th layer, where $i=1, 2 \ldots, n$, by holes which are created through insulation material layers in between and filled with copper plating. Electrical connections are also accomplished between the $4i$-th layer and the $(4i-3)$-th layer by holes created through insulation material layers in between and filled with copper plating.

In accordance with the present invention, a muli-layer printed circuit bare board comprises: at least two insulative layers each having two generally flat, primary surfaces; circuit layers including electrically conductive material forming electric circuitry and carried on at least one of the primary surfaces of said insulative layers; and bonding layers of insulative material intervening between adjacent ones of said insulative layers and bonding said adjacent insulative layers with each other to accumulate said circuit layers with one above the other; at least one of said insulative layers having a first through hole open to the primary surfaces thereof and filled with electrically conductive material interconnecting the circuit layers carried thereon with each other.

In an aspect of the invention, said electrically conductive material may advantageously be of copper plating.

Further in an aspect of the invention, said first through hole may preferably have a diameter of 40 micro-meter or less.

Advantageously in accordance with the present invention, one of said insulative layers and one of said bonding layers which is bonded to said first insulative layer have a second through hole cut therethrough to extend to the primary surface of second one of said insulative layers which is bonded to said one bonding layer, said second through hole being filled with electrically conductive material interconnecting the circuit layers carried on said first and second insulative layers with each other.

In accordance with the present invention, a multi-layer printed circuit bare board comprises: 2n circuit layers having electrically conductive material forming electric circuitry, where n is a natural number exceeding a unity; n insulative layers having two primary surfaces on which $(2i-1)$-th and $2i$-th ones of said circuit layers are carried, where i is a natural number not exceeding n; and n–1 bonding layers of insulative material intervening between adjacent ones of said n insulative layers and bonding said adjacent insulative layers with each other to accumulate said circuit layers with one above the other; the insulative layers between the $(2i-1)$-th and $2i$-th circuit layers having a first through hole open to the primary surfaces thereof and filled with electrically conductive material interconnecting the (2i−1)-th and 2i-th circuit layers with each other.

Further in accordance with the present invention, a method of manufacturing a multi-layer printed circuit bare board comprises the steps of: preparing n sheets of insulatlve material, where n is a natural number exceeding a unity; making first holes through the sheets of insulative material for interconnecting (2i−1)-th and 2i-th circuit layers to be respectively carried on two primary surfaces of the sheets of insulative material, where i is a natural number not exceeding n; depositing electrically conductive material inside the first holes using an electrical plating process until the holes are filled with the conductive material; forming an electrically conductive pattern of the (2i−1)-th and 2i-th circuits on the sheet of insulative material; stacking the sheets of insulative material having the electrically conductive pattern formed one above the other and adhering adjacent ones of the sheets with each other by using bonding material; making second holes through (2i−1)-th and (2i+1)-th circuit layers; and depositing electrically conductive material inside the second holes using an electrical plating process.

BRIEF DESCRIPTION OF THE DRAWINGS

The objects and features of the present invention will become more apparent from consideration of the following detailed description taken in conjunction with the accompanying drawings in which:

FIG. 1 is a schematic cross sectional view showing a preferred embodiment of the multi-layer printed circuit bare board in accordance with the present invention.

DESCRIPTION OF THE PREFERRED EMBODIMENT

Figure 2A:
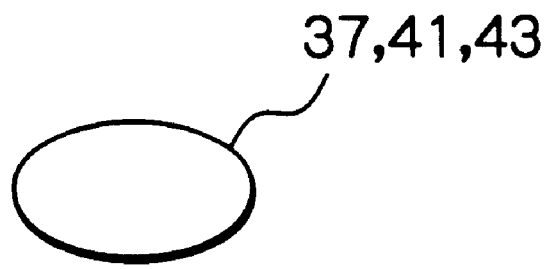
FIGS. 2A and 2B show exemplified shapes of holes cut through an insulation material of the embodiment shown in FIG.1.

With reference to FIG. 1, a multi-layer printed circuit bare board (MLB), generally denoted with a reference numeral 1, in accordance with a preferred embodiment of the present invention has 2n multiple layers 3, 5, 9, 13, 29, 25, 21 and 19, where n is a natural number exceeding a unity (1), which form electric circuitry. The multi-layer printed circuit bare board 1 has a generally rectangular plan view with a couple of generally flat, primary surfaces 61 and 63. FIG. 1 shows a cross section substantially perpendicular to the primary surfaces 61 and 63. The specific layer structure shown in FIG. 1 includes eight layers, i e. n is 4. The invention is not restricted to the specific illustrative embodiment but applicable to a generic case comprising 2n circuit Layers. in addition, the invention is also applicable to a multi-layered structure of printed circuit bare board which has even an odd number of circuit layers such as layers 3 and 5 accumulated one above the other.

The multiple layers 3, 5, 9, 13, 29, 25, 21 and 19 are formed on the primary surfaces of electrically insulative material layers 35 to establish electro-conductive wiring 69 forming circuit patterns. The first layer 3 from the top in the figure is interconnected to the second layer 5 by a connector 7, and also to the third layer 9 by a connector 11. Likewise, the fourth layer 13 is interconnected to the third layer 9 by a connector 15, and also to the first layer 3 by a connector 17. In the same way, the 4n-th, or lowest, layer 19 is interconnected to the (4n−1)-th layer 21 by a connector 23, and also to the (4n−2)- the layer 25 by a connector 27. The (4n−3)-th layer 29 is interconnected to the (4n−2)-th layer 25 by a connector 31, and also to the 4n-th layer 19 by a connector 33.

Holes 37, which are preferably 40 micrometer or less in diameter, are created through, and substantially perpendicularly to, insulative material layers 35 between the first layer 3 and the second layer 5, between the third layer 9 and the fourth layer 13, between the 4n-th layer 19 and the (4n−1)-th layer 21, and between the (4n−2)-th layer 25 and the (4n−3)-th layer 29. The diameter of the holes 37 is 40 micrometer or less, more preferably 25–30 micrometer, and preferably not less than 15 micrometer. Those holes 37 are filled with copper plating 39, making connection from the first layer 3 to the second layer 5, from the third layer 9 to the fourth layer 13, from the 4n-th layer 19 to the (4n−1)-th layer 21, and from the (4n−2)-th layer 25 to the (4n−3)-th layer 29.

A hole 41 is also cut from the first layer 3 through an insulative, bonding layer 45 to extend to the connector 15, which is a copper-filled via formed on the third layer 9, and another hole 43 is cut from the 4n-th layer 19 through another insulative, bonding layer 45 to extend to the connector 31, which is also a copper-filled via on the (4n−2)-th layer 25. The holes 41 and 43 are plated with copper plating 39, making electrical connections from the first layer 3 to the fourth layer 13 and from the 4n-th layer 19 to the (4n−3)-th layer 29, respectively.

Holes 65 and 67 are also cut from the first and 4n-th layers 3 and 19 through the insulative, bonding layers 45 to reach the third and (4n−2)-th layers 9 and 21, respectively, as shown in the figure. The holes 65 and 67 are also plated with copper plating 39, making electrical connections from the first layer 3 to the third layer 13 and from the 4n-th layer 19 to the (4n−2)-th layer 29, respectively.

Those holes 37, 41, 43, 65 and 67 may advantageously be of a circular cross section perpendicular to the primary surfaces of the insulative material sheets 35. The invention is not restricted to this particular cross-sectional shape of the holes but may also be applicable to the oval shape shown in FIG. 2A, and also to cylindrical through holes which have a cross-section perpendicular to the longitudinal axis thereof and formed by a couple of opposing sectors interconnected to each other by straight lines.

The insulation material layers 35 may advantageously be made of either of glass epoxy, glass BT, glass polyimide, polyimide film, epoxy film, epoxy impregnated liquid crystal polymer fiber cloth, BT impregnated liquid crystal polymer fiber cloth, for example. Conductive material for wiring circuits 39 may be of copper or other metal.

Figure 2B:
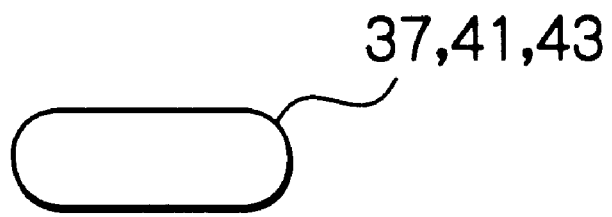

A laser or drilling method would be favored to make holes 37 for the connections from the first layer 3 to the second layer 5, from the third layer 9 to the fourth layer 13, from the 4n-th layer 19 to the (4n−1)-th layer 21, and from the (4n−2)-th layer 25 to the (4n−3)-th layer 29. The size of the holes 37 would be favored to be 40 micrometer or less in diameter considering the wiring space and the copper filling process. On the other hand, the electric conductivity of the 40-micrometer in diameter holes 37 might be higher than the other part of the circuitry, though it is desirable to have similar conductivity throughout the circuitry. In order to achieve this, the holes 37 may have an oval or elliptical shape as illustrated in FIGS. 2A and 2B, such that the area of the holes 37 may be increased with the dimension in a particular direction maintained to be 40 micrometer or less. As a result, the conductivity of the copper-filled vias may be adjusted to be substantially equal to that of the remaining portions of the circuitry, without enlarging the dimension of the holes 37 in a desired direction. That is also the case with the remaining holes 41, 43, 65 and 67.

In order to deposit conductive material inside the holes 37, 41, 43, 65 and 67, Pd, carbon, or polymer with electro-conductive particles dispersed therein may advantageously be deposited by using an absorption method. Electroless copper plating may follow this. Instead of an absorption method, a vapor deposition method may be used to form thinner conductive film inside the holes.

An electrical plating method that is used for the manufacturing of conventional printed circuit boards may be used for the plating of the holes 37, 41, 43, 65 and 67. In such cases, the plating thickness of 20 micrometer or more would advantageously fill the holes 37, 41, 43, 65 and 67. An electroless plating method may be used instead. A negative image pattern of the circuit may be formed on the insulation material 35, so that the via filling plating and the pattern plating may be done simultaneously.

In some application, the hole 65 may be extended and interconnected to the fifth layer 29 with or without being connected to the third and/or fourth layers 9 and/or 13. Such a hole may also be interconnected to a connector, such as 31, formed in the insulating layer 35.

The conductive patterns of electronics or circuitry 69 are formed on the insulating layers 35 by using a subtractive method, with which an etching mask is formed over the copper foil that is laminated on the insulation material 35 on the side where the desired conductive pattern 69 is to be formed, and then unwanted portions of the copper foil is etched way. Either of a liquid, film, or electro-deposited type of material may be used as the etching resist.

The insulation materials 35 which have a desired copper circuit pattern formed thereon are registered with each other to be laminated or stacked with each other by using the bonding or adhesive material layer 45. More specifically, multi-layer structures 51, 53, 55 and 57 that consist of the first layer 3 and the second layer 5, the third layer 9 and the fourth layer 13, the 4n-th layer 19 and the (4n−1)-th layer 21, and the (4n−2)-th layer 25 and the (4n−3)-th layer 29, respectively, are accumulated in this order and laminated with each other with the bonding material 45 intervening to form the multi-layer printed circuit bare board 1 consequently.

A laser method may favorably be used for forming the holes on the resultant printed circuit bare board 1. Either of carbon dioxide gas, YAG (yttrium aluminum garnet), UV (ultra-violet)-YAG, or excimer laser may advantageously be applicable.

A detailed description on the manufacturing process steps of the multi-layer printed circuit bare board 1 shall follow. First of all, the cylindrical through holes 37 are created through the insulation material layers 35 in order to make connection from the first layer 3 to the second layer 5, from the third layer 9 to the fourth layer 13, from the 4n-th layer 19 to the (4n−1)-th layer 21, and from the (4n−2)-th layer 25 to the (4n−3)-th layer 29.

Then, conductive material is deposited inside the holes 37, and copper 39 for example is electrically plated until the holes are filled. Successively, conductive circuit patterns are formed on the insulation material layers 35.

The multi-layer structures 51, 53, 55 and 57 that consist of the first layer 3 and the second layer 5, the third layer 9 and the fourth layer 13, the 4n-th layer 19 and the (4n−1)-th layer 21, and the (4n−2)-th layer 25 and the (4n−3)-th layer 29, respectively, are stacked and adhered with each other by using bonding material 45 into a laminated structure.

After that, the holes 41 and 43 are created from the first layer 3 to the third layer 9, and from the 4n-th layer 19 to the (4n−2)-th layer 25. Conductive material is deposited inside the holes 41 and 43 that come through the first layer 3 to the third layer 9 and through the 4n-th layer 19 to the (4n−2)-th layer 25, respectively, to establish the electrical copper plating 39, so that the bare board 1 is finally formed. If necessary, an additional layer of conductive pattern may be formed over the most outer layers 3 and 19, for example.

With the multi-layer printed circuit bare board 1, which has as 4n layers, the holes 37 are created through the insulation material 35 between the first layer 3 and the second layer 5, between the third layer 9 and the fourth layer 13, the 4n-th layer 19 and the (4n−1)-th layer 21, and between the (4n−2)-th layer 25 and the (4n−3)-th layer, 29 respectively, and are filled with the copper plating 39, making connections between the first layer 3 and the second layer 5, between the third layer 9 and the fourth layer 13, the 4n-th layer 19 and the (4n−1)-th layer 21, and between the (4n−2)-th layer 25 and the (4n−3)-th layer 29, respectively. Th e connections can therefore be accomplished separately for each of the multi-layer structures 51, 53, 55 and 57 by making the holes 37 and the copper plating 39 between the first layer 3 and the second layer 5, between the third layer 9 and the fourth layer 13, between the 4n-th layer 19 and the (4n−1)-th layer 21, and between the (4n−2)-th layer 25 and the (4n−3)-th layer 29, respectively. After that, those multi-layer structures 51, 53, 55 and 57 with the connections thus established will be accumulated with each other to enable further connections between the intended layers.

Making the hole 41 from the first layer 3 to the copper-filled via 15 on the third layer 9 and the hole 43 from the 4n-th layer 19 to the copper-filled via on the (4n−2)-th layer 25, and plating the holes 41 and 43 with the copper 39 enable the connections from the first layer 3 to the fourth layer 13 and from the 4n-th layer 19 to the (4n−3)-th layer 29, such that the interconnections through the laminated multi-layer structures 51, 53, 57 and 55 can be achieved between the intended layers with the fewer manufacturing process steps.

EXAMPLE

A detailed description will be made on an example where some multi-layer printed circuit bare boards of the structure On accordance with the invention were manufactured together with the result of the performance tests.

The holes of 25 micrometer in diameter were created through a copper-clad laminate (marketed from Matsushita Denko Kabushiki Kaisha, model R-1705; laminate thickness 0.06 mm, copper foil thickness 12 micrometer) using UV-YAG laser. After the laminates were processed through Pd catalyst solution, electroless copper plating was done. Then electrical copper plating was done until copper is deposited up-to 20 micrometer over the surface to fill the via holes.

A photoresist (marketed from Asahi Chemical Industry Co., Ltd., model AQ-2588) was laminated over the surface of the laminates, and an etching mask was formed through an exposure and development process. Then the unmasked portions of the copper foil were etched off through a cupric oxide solution to get 40-micrometer width and spacing copper circuit patterns.

The laminates on which the copper circuit patterns were formed were stacked up with sheets of bonding material intervening between them, registered in respect to circuit images, and thereafter the materials were press-laminated to make the 8-layered structure. Then holes were created form the outermost layers to the connector areas of the third and fourth layers and of the fifth and sixth layer with the 80-micrometer in diameter beam of YAG-laser applied from the both sides thereof.

The boards thus fabricated were processed through a Pd catalyst solution, electroless copper plating, and further electrical copper plating. Then dry-film photo-resist (produced by Asahi Chemical Industry Co., Ltd., model AQ-2588) was laminated, and circuits were formed through exposure, development, and etching, to finally obtain 220 mm-wide, 220 mm-long, 0.6 mm-thick 8-layer printed circuit bare boards.

A heat cycle test was performed at −65° C. to 125° C. for 1000 cycles with these multi-layer printed circuit bare boards, and no defects were found such as delamination or crack.

Moreover, it was verified that the wiring density with those multi-layer printed circuit bare boards was approximately four times as high as that of the conventional through hole printed boards. That confirmed that a higher interconnection density of the packaging is possible.

It was also verified that the process steps were fewer by a factor of 18 than those of the conventional built-up multi-layer printed circuit bare board with the same number of layers.

In summary, as described above, with the multi-layer printed circuit bare board having 4n layers stacked up, holes are machined through the insulation material layers that lay between the first and second layers, between the third and fourth layers, between the 4n-th and (4n−1)-th layers, and between the (4n−2)-th and (4n−3)-th layers, and filled with copper plating, thus establishing electrical interconnections between the first and second layers, between the third and fourth layers, between the 4n-th and (4n−1)-th layers, and between the (4n−2)-th and (4n−3)-th layers.

Making holes from the first layer to the copper-filled vias on the third layer and from the 4n-th layer to the copper-filled viason the (4n−2)-th layer, and plating these holes make connections between the first and fourth layers and between the 4n-th and (4n−3)-th layers, such that interconnections through the laminated multi-layer structures between the intended layers are established with fewer manufacturing process steps. As a result, with this multi-layer printed circuit bare board, it is possible to increase the wiring density at lower manufacturing cost than that of the conventional built-up multi-layer printed circuit bare boards.

In accordance with the manufacturing process for the multi-layer printed circuit bare board of the invention, holes are formed through the insulation material between the conductive layers, and filled with copper plating, and the resultant multi-layer structures are laminated, that consist of the first and second layers, the third and fourth layers, the 4nth and (4n−1)-th layers, and the (4n−2)-th and (4n−3)-th layers, respectively, using insulation bonding material. Holes are cut from the first layer to the third layer and from the 4n-th layer to the (4n−2)-th layer, and electrically plated with copper. This enables direct connections between the intended layers by the via holes made after lamination, and achieves connections between the first layer and the fourth layer, and between the 4n-th layer and the (4n−3)-th layer with fewer process steps and higher dimensional accuracy than the conventional buit-up method in which the mulilayer structure is formed layer by layer by repeating similar process steps.

The entire disclosure of Japanese patent application No. 2000-069637 filed on Mar. 14, 2000, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A multi-layer printed circuit bare board comprising:
    at least two insulative layers each having two generally flat, primary surfaces;
    circuit layers including electrically conductive material forming electric circuitry and carried on at least one of the primary surfaces of said insulative layers; and
    bonding layers of insulative material intervening between adjacent ones of said insulative layers and bonding said adjacent insulative layers with each other to accumulate said circuit layers with one above the other;
    at least one of said insulative layers having a first through hole open to the primary surfaces thereof and filled with electrically conductive material interconnecting the circuit layers carried therein with each other;
    said first through hole having a substantially circular cross section perpendicular to a longitudinal axis thereof, and having a diameter of 40 micro-meter or less.

2. The bare board in accordance with claim 1, wherein said electrically conductive material is of copper plating.

3. The bare board in accordance with claim 1, wherein first one of said insulative layers and one of said bonding layers which is bonded to said first insulative layer have a second through hole cut therethrough to extend to one of said circuit layers which is carried on the primary surface of second one of said insulative layers which is bonded to said one bonding layer, said second through hole being filled with electrically conductive material interconnecting the circuit layers carried on said first and second insulative layers with each other.

4. The bare board in accordance with claim 3, wherein said second through hole extends to said electrically conductive material filling the first through hole.

5. The bare board in accordance with claim 3, wherein said electrically conductive material is of copper plating.

6. The bare board in accordance with claim 3, wherein said second through hole has a substantially circular cross section perpendicular to a longitudinal axis thereof.

7. A multi-layer printed circuit bare board comprising:
    at least two insulative layers each having two generally flat, primary surfaces;
    circuit layers including electrically conductive material forming electric circuitry and carried on at least one of the primary surfaces of said insulative layers; and
    bonding layers of insulative material intervening between adjacent ones of said insulative layers and bonding said adjacent insulative layers with each other to accumulate said circuit layers with one above the other;
    at least one of said insulative layers having a first through hole open to the primary surfaces thereof and filled with electrically conductive material interconnecting the circuit layers carried thereon with each other;
    wherein first one of said insulative layers and one of said bonding layers which is bonded to said first insulative layer have a second through hole cut therethrough to extend to one of said circuit layers which is carried on the primary surface of second one of said insulative layers which is bonded to said one bonding layer, said second through hole being filled with electrically conductive material interconnecting the circuit layers carried on said first and second insulative layers with each other;
    said second through hole having a substantially oval or elliptical cross section perpendicular to a longitudinal axis thereof.

8. The bare board in accordance with claim 7, wherein said substantially oval or elliptical cross section has a shortest axis of 40 micro-meter or less.

9. A multi-layer printed circuit bare board comprising:

2n circuit layers having electrically conductive material forming electric circuitry, where n is a natural number exceeding a unity;

n insulative layers having two primary surfaces on which (2i−1)-th and 2i-th ones of said circuit layers are carried, where i is a natural number not exceeding n and increments in a direction perpendicular to the primary surfaces, and n−1 bonding layers of insulative material intervening between adjacent ones of said n insulative layers and bonding said adjacent insulative layers with each other to accumulate said circuit layers with one above the other;

the insulative layers between the (2i−1)-th and 2i-th circuit layers having a first through hole open to the primary surfaces thereof and filled with electrically conductive material interconnecting the (2i−1)-th and 2i-th circuit layers with each other;

said first through hole having a substantially circular or substantially oval or elliptical cross section perpendicular to a longitudinal axis thereof, and having a diameter or a shortest axis of 40 micro-meter or less, respectively.

10. The bare board in accordance with claim 9, wherein the insulative layers between the (2i−1)-th and 2i-th circuit layers and one of said bonding layers which is bonded to said I-th insulative layer further have a second through hole open to the primary surfaces thereof, said second through hole being filled with electrically conductive material interconnecting the (2i−1)-th and (2i+1)-th circuit layers with each other.

11. The bare board in accordance with claim 10, wherein said second through hole extends to said electrically conductive material filling the first through hole.

12. A multi-layer printed circuit bare board comprising:

at least two insulative layers each having two generally flat, primary surfaces;

circuit layers including electrically conductive material forming electric circuitry and carried on at least one of the primary surfaces of said insulative layers; and bonding layers of insulative material intervening between adjacent ones of said insulative layers and bonding said adjacent insulative layers with each other to accumulate said circuit layers with one above the other;

at least one of said insulative layers having a first through hole open to the primary surfaces thereof and filled with electrically conductive material interconnecting the circuit layers carried therein with each other;

said first through hole having a substantially oval or elliptical cross section perpendicular to a longitudinal axis thereof.

13. The bare board in accordance with claim 12, wherein said substantially oval or elliptical cross section has a shortest axis of 40 micro-meter or less.

14. The bare board in accordance with claim 12, wherein first one of said insulative layers and one of said bonding layers which is bonded to said first insulative layer have a second through hole cut therethrough to extend to one of said circuit layers which is carried on the primary surface of second one of said insulative layers which is bonded to said one bonding layer, said second through hole being filled with electrically conductive material interconnecting the circuit layers carried on said first and second insulative layers with each other.

15. The bare board in accordance with claim 14, wherein said second through hole extends to said electrically conductive material filling the first through hole.

16. The bare board in accordance with claim 14, wherein said electrically conductive material is of copper plating.

17. The bare board in accordance with claim 14, wherein said second through hole has a substantially circular cross section perpendicular to a longitudinal axis thereof.

18. A multi-layer printed circuit bare board comprising:

at least two insulative layers each having two generally flat, primary surfaces;

circuit layers including electrically conductive material forming electric circuitry and carried on at least one of the primary surfaces of said insulative layers; and bonding layers of insulative material intervening between adjacent ones of said insulative layers and bonding said adjacent insulative layers with each other to accumulate said circuit layers with one above the other;

at least one of said insulative layers having a first through hole open to the primary surfaces thereof and filled with electrically conductive material interconnecting the circuit layers carried thereon with each other;

wherein first one of said insulative layers and one of said bonding layers which is bonded to said first insulative layer have a second through hole cut therethrough to extend to one of said circuit layers which is carried on the primary surface of second one of said insulative layers which is bonded to said one bonding layer, said second through hole being filled with electrically conductive material interconnecting the circuit layers carried on said first and second insulative layers with each other;

said second through hole having a substantially circular cross section perpendicular to a longitudinal axis thereof;

said second through hole having a diameter of 40 micro-meter or less.

19. A multi-layer printed circuit bare board comprising:

2n circuit layers having electrically conductive material forming electric circuitry, where n is a natural number exceeding a unity;

n insulative layers having two primary surfaces on which (2i−1)-th and 2i-th ones of said circuit layers are carried, where i is a natural number not exceeding n and increments in a direction perpendicular to the primary surfaces; and n−1 bonding layers of insulative material intervening between adjacent ones of said n insulative layers and bonding said adjacent insulative layers with each other to accumulate said circuit layers with one above the other;

the insulative layers between the (2i−1)-th and 2i-th circuit layers and one of said bonding layers which is bonded to said i-th insulative layer have a through hole open to the primary surfaces thereof, said through hole being filled with electrically conductive material interconnecting the (2i−1)-th and (2i+1)-th circuit layers with each other;

wherein said through hole has a substantially circular, or substantially oval or elliptical cross section perpendicular to a longitudinal axis thereof, and has a diameter or a shortest axis of 40 micro-meter or less, respectively.

* * * * *

UNITED STATES PATENT AND TRADEMARK OFFICE
CERTIFICATE OF CORRECTION

PATENT NO.     : 6,492,007 B1                                                                Page 1 of 1
DATED          : December 10, 2002
INVENTOR(S)    : Hiroshi Iinaga It is certified that error appears in the above-identified patent and that said Letters Patent is hereby corrected as shown below:

<u>Title page,</u>
Item [30], Foreign Application Priority Data, please correct the foreign priority date from "Mar. 14, 2002" to -- Mar. 14, 2000 --.

Signed and Sealed this

Fifth Day of August, 2003

JAMES E. ROGAN
*Director of the United States Patent and Trademark Office*